United States Patent
Spielman et al.

(10) Patent No.: US 6,873,225 B2
(45) Date of Patent: Mar. 29, 2005

(54) DIPLEXERS WITH LOW PASS FILTER HAVING DISTRIBUTED AND NON-DISTRIBUTED (LUMPED) ELEMENTS

(75) Inventors: Mark Spielman, Norwalk, CT (US); Necdet Ergul, Greenwich, CT (US)

(73) Assignee: Microphase Corporation, Norwalk, CT (US)

( * ) Notice: Subject to any disclaimer, the term of this patent is extended or adjusted under 35 U.S.C. 154(b) by 0 days.

(21) Appl. No.: 10/414,677

(22) Filed: Apr. 15, 2003

(65) Prior Publication Data

US 2004/0207483 A1 Oct. 21, 2004

(51) Int. Cl.[7] ................................................ H01P 5/12
(52) U.S. Cl. ........................ 333/126; 333/202; 333/207
(58) Field of Search .............................. 333/33, 35, 167, 333/185, 206, 207, 202, 126, 127, 129, 134, 203, 132; 327/558

(56) References Cited

U.S. PATENT DOCUMENTS

| | | | | | |
|---|---|---|---|---|---|
| 3,956,717 A | * | 5/1976 | Fisher et al. | ................. | 333/121 |
| 4,288,759 A | * | 9/1981 | Stover | ...................... | 333/24 R |
| 4,499,495 A | * | 2/1985 | Strammello | .................. | 348/731 |
| 5,548,255 A | | 8/1996 | Spielman | ..................... | 333/132 |
| 5,576,673 A | * | 11/1996 | Asija | ............................ | 333/206 |
| 5,793,265 A | | 8/1998 | Spielman | ..................... | 333/132 |
| 5,801,605 A | | 9/1998 | Filakovsky | .................. | 333/203 |
| 5,929,722 A | * | 7/1999 | Kono | ........................... | 333/177 |
| 5,933,770 A | * | 8/1999 | Heiter | ......................... | 455/307 |
| 5,959,592 A | * | 9/1999 | Petruzzelli | .................... | 725/68 |
| 6,018,278 A | * | 1/2000 | Tang | .......................... | 333/100 |
| 6,255,920 B1 | * | 7/2001 | Ohwada et al. | ............. | 333/206 |
| 6,509,812 B2 | * | 1/2003 | Sayyah | ....................... | 333/156 |
| 6,559,808 B1 | * | 5/2003 | Petzold et al. | .............. | 343/787 |
| 6,587,019 B2 | * | 7/2003 | Chawla et al. | .............. | 333/176 |
| 6,606,015 B2 | * | 8/2003 | Uriu et al. | ................... | 333/132 |
| 6,703,912 B2 | * | 3/2004 | Suma et al. | ................. | 333/206 |
| 6,734,767 B2 | * | 5/2004 | Vanoverschelde et al. | .. | 333/214 |
| 6,747,527 B2 | * | 6/2004 | Nakamura et al. | .......... | 333/126 |

* cited by examiner

*Primary Examiner*—Timothy P. Callahan
*Assistant Examiner*—Hai L. Nguyen
(74) *Attorney, Agent, or Firm*—David Aker

(57) ABSTRACT

A low pass filter comprises a first series of transmission line elements connected between an input and an output; and a second series of shunt elements connected from the transmission line elements to a ground of the filter. At least one of the shunt elements has a distributed portion and a lumped portion. The distributed portion may comprise a tube mounted tangentially on a printed circuit board. The lumped portion may comprises a coil with a first lead connected to the first series of transmission line elements, and a second lead extending into the tube. A tuning element is moveably disposed in the tube. The tuning element may have an opening for receiving the second lead of the coil. The low pass filter may be used in a diplexer with one or more high pass filters. The diplexer may include power transmission apparatus.

50 Claims, 5 Drawing Sheets

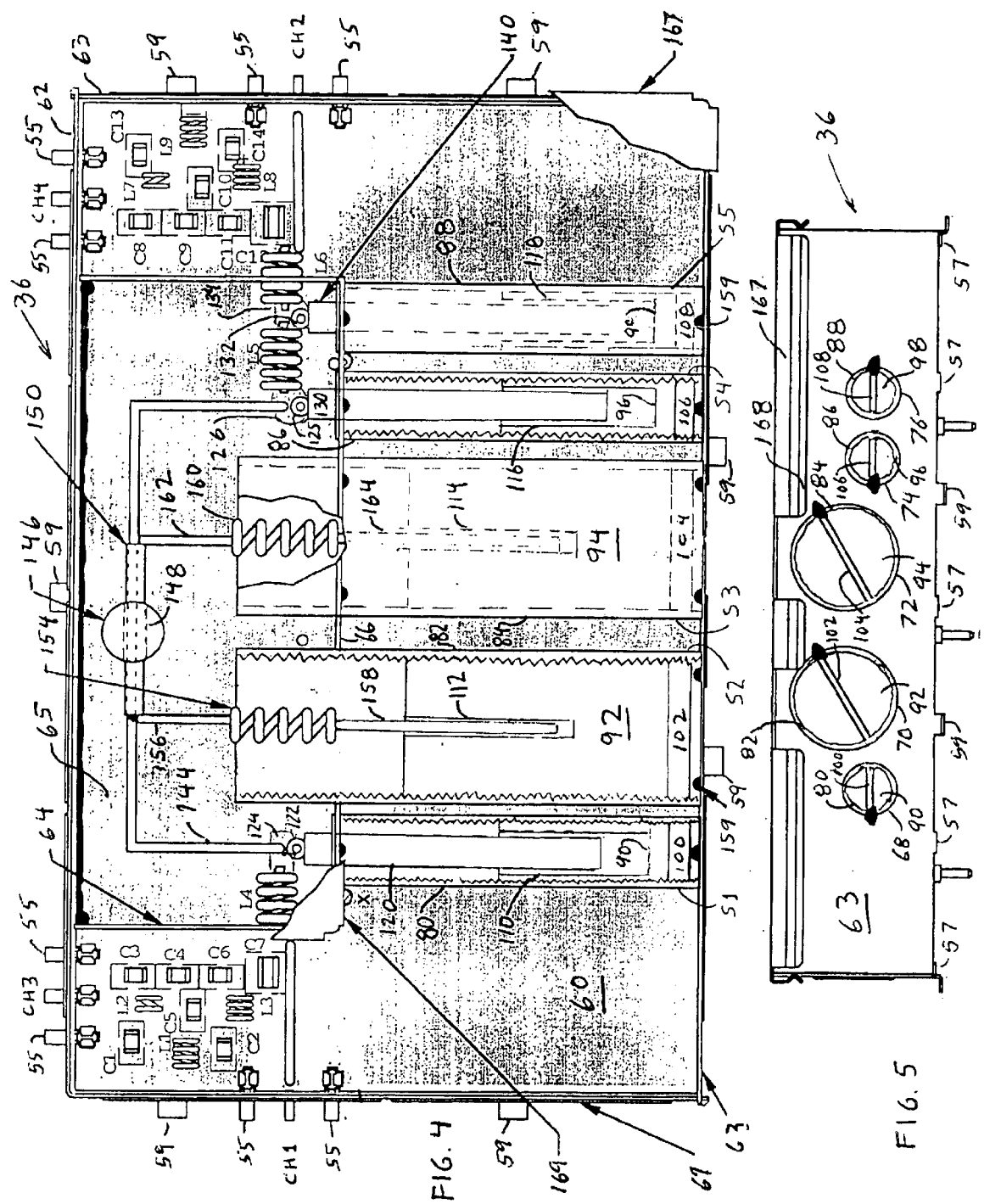

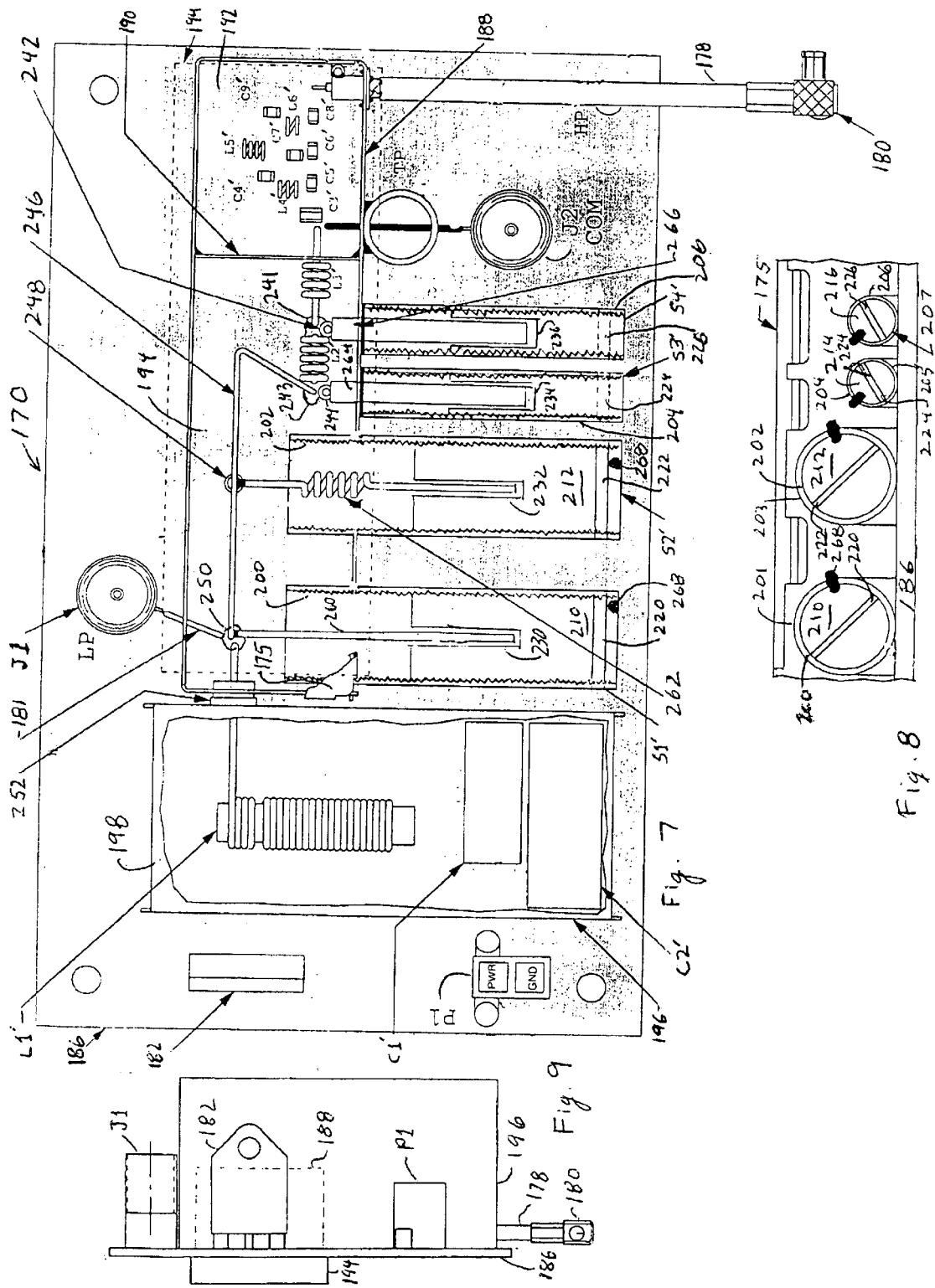

DIPLEXERS WITH LOW PASS FILTER HAVING DISTRIBUTED AND NON-DISTRIBUTED (LUMPED) ELEMENTS

BACKGROUND OF THE INVENTION

1. Field of the Invention

The present invention relates to diplexers. More particularly, it relates to diplexers that mat be used in cable systems providing both television and high speed data services.

2. Prior Art

There have been a variety of diplexerers, some of which have been used in cable systems. However, in general, these have been heavy bulky, and have required large parts which must be machined. The cost of manufacture of such devices is high, thus limiting their use to military and other specialized applications where high costs can be tolerated.

SUMMARY OF THE INVENTION

It is an object of the invention to provide a diplexer which is low in cost and provides high performance.

It is another object of the invention to provide a diplexer which can be manufactured using inexpensive and components which are of low weight.

It is yet another object of the invention to provide a diplexer which small in size.

These objects and others are achieved in accordance with the invention by a low pass filter comprising a first series of transmission line elements connected between an input and an output of the low pass filter and a second series of shunt elements connected from the transmission line elements to a ground of the low pass filter, wherein at least one of the shunt elements has a distributed portion and a lumped portion. The distributed portion may comprise a tube. The lumped portion may comprises a coil with a first lead connected to the first series of transmission line elements, and a second lead extending into the tube.

The low pass may further comprising a tuning element moveably disposed in the tube. The tuning element may have an opening for receiving the second lead of the coil.

The shunt elements may each comprise a tube. The tubes may be mounted tangentially on a printed circuit board.

The first series of transmission line elements may include a wire connected between a first land on the printed circuit board and a second land on the printed circuit board, the wire having a portion positioned to extend in a direction parallel to a plane of the printed circuit board. The low pass filter may further comprise a support member extending from the circuit board for supporting the wire at a predetermined distance from the circuit board. An insulating sleeve may be disposed around the wire, the sleeve being positioned to insulate the wire from the support member. The insulating sleeve and the support member may thus form an additional shunt element of the low pass filter.

The low pass may further comprise at least one lumped element connected in series with the first series of transmission line elements. At least one lumped element may comprise a coil. The lumped element may be connected to lands on a circuit board. The lumped portion may comprise a coil with a first lead connected to the first series of transmission line elements, and a second lead extending into one of the tubes.

At least one of the first series of the shunt elements may comprise a tube, and the low pass filter may further comprise an electrical conductor connected to the first transmission line elements, and a tuning element movable within the tube, the tuning element having an opening for receiving the electrical conductor. The electrical conductor may be a rod.

The low pass filter may further comprise a circuit board on which the tube is mounted, and a pin extending from the circuit board, an end of the rod being soldered to the pin.

In accordance with another aspect of the invention, a low pass filter comprises a first series of transmission line elements connected between an input and an output of the low pass filter; and a second series of shunt elements connected from the transmission line elements to a ground of the low pass filter, at least one shunt element including a tube and a conductor extending into the tube, the tube being mounted on a circuit board.

In a further aspect, the invention is directed to a diplexer comprising a low pass filter including a first series of transmission line elements connected between an input and an output of the low pass filter; and a second series of shunt elements connected from the transmission line elements to a ground of the low pass filter, at least one of the shunt elements having a distributed portion and a lumped portion; and a high pass filter connected between the input of the low pass filter and a first high pass filter output. The diplexer may further comprise an additional high pass filter connected between the output of the low pass filter and a second high pass filter output. The high pass filter or each of the high pass filters may serve as an impedance transformer. The first high pass filter output and second high pass filter output may match a lower impedance than that of the input of the low pass filter and the output of the low pass filter. The lower impedance may be fifty ohms.

The low pass filter may be adapted to carry electrical power from an electrical power source between the input and an output of the low pass filter. The first series of transmission line elements may carry the power. The diplexer may further comprise a power management circuit for receiving and distributing the power. The power management circuit may comprise a choke having a first terminal connected to the output of the low pass filter, and bypass capacitance connected from a second terminal of the choke to ground of the diplexer. The bypass capacitance may comprise a first relatively large capacitor, and a second smaller capacitor for providing a low impedance for high frequency signals. A power protection element, such as a sidactor, may be connected in parallel with the capacitance. A power connector may be connected in parallel with the capacitance.

In this further aspect of the invention, the distributed portion may comprise a tube mounted tangentially on a printed circuit board. The lumped portion may comprise a coil with a first lead connected to the first series of transmission line elements, and a second lead extending into the tube. A tuning element may be moveably disposed in the tube. The tuning element may have an opening for receiving the second lead of the coil.

The first series of transmission line elements may include a wire connected between a first land on the printed circuit board and a second land on the printed circuit board, the wire having a portion positioned to extend in a direction parallel to a plane of the printed circuit board. A support member may extend from the circuit board for supporting the wire at a predetermined distance from the circuit board. An insulating sleeve may be disposed around the wire, the sleeve being positioned to insulate the wire from the support member. The insulating sleeve and the support member form an additional shunt element of the low pass filter.

BRIEF DESCRIPTION OF THE DRAWINGS

The foregoing aspects and other features of the present invention are explained in the following description, taken in connection with the accompanying drawings, wherein:

FIG. 4 is an enlarged, cut-away, partially cross-sectional plan view of the embodiment of FIG. 1.

FIG. 5 is a front elevational view of the embodiment of FIG. 3 and FIG. 4.

FIG. 7 is an enlarged, cut-away, partially cross-sectional plan view of the embodiment of FIG. 6.

FIG. 8 is a partial, enlarged front elevational view of the embodiment of FIG. 6.

FIG. 9 is a side elevational view of the diplexer of the embodiment of FIG. 6.

DETAILED DESCRIPTION OF THE PREFERRED EMBODIMENTS

Figure 1:
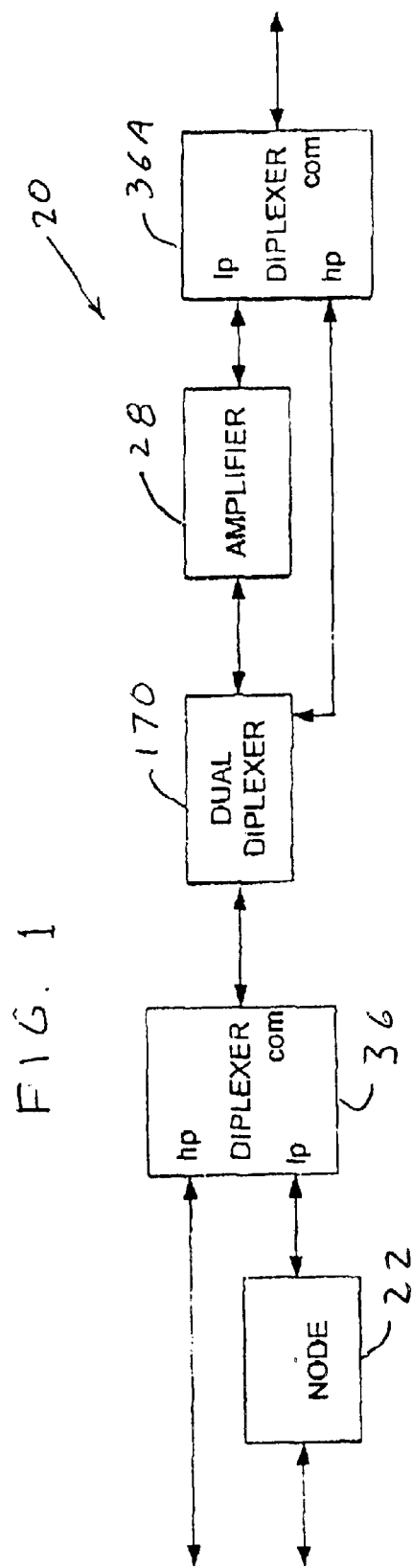
FIG. 1 is a block diagram of the manner in which the diplexers of the present invention may be connected in a system.

Although the present invention will be described with reference to the embodiments shown in the drawings, it should be understood that the present invention can be embodied in many alternate forms of embodiments. In addition, any suitable size, shape or type of elements or materials could be used.

Referring to FIG. 1, there is shown a block diagram of a portion of a cable system, and more specifically a cable television system 20 incorporating the diplexers in accordance with the present invention in various locations. A cable system, head end (not shown), which may be located at a central office or other suitable location, is connected by, generally, a dual direction broad band fiber optic communication path (not shown), to a first side of a connection node 22. Node 22 serves to convert optical signals to radio frequency signals for distribution to customers, as more fully described below. The other side of connection node 22 is connected to a first dual diplexer 36 in accordance with the invention. In this manner of use, diplexer 36 functions as a combiner, combining relatively low frequency television signals (DC to 860 Mhz) at its lp input, and high frequency data signals, generally in the 907 MHz to 2,500 MHz frequency range, provided at its hp input. The combined signals appear at the common (com) output.

A diplexer 170, also in accordance with the invention and described below, may be used to separate the combined signals into the low frequency signals and the high frequency signals described above. The low frequency signals are sent to and amplified by a line extender amplifier 28. The high frequency data signals are sent to the hp input of a diplexer 36A, which may be identical to diplexer 36 in construction and function. After amplification by line extender amplifier 28 the low frequency cable television signals are passed to the lp input of diplexer 36A, which acts as a combiner to combine the low frequency and high frequency signals, and provide the combined signals at its common output com.

Figure 2:
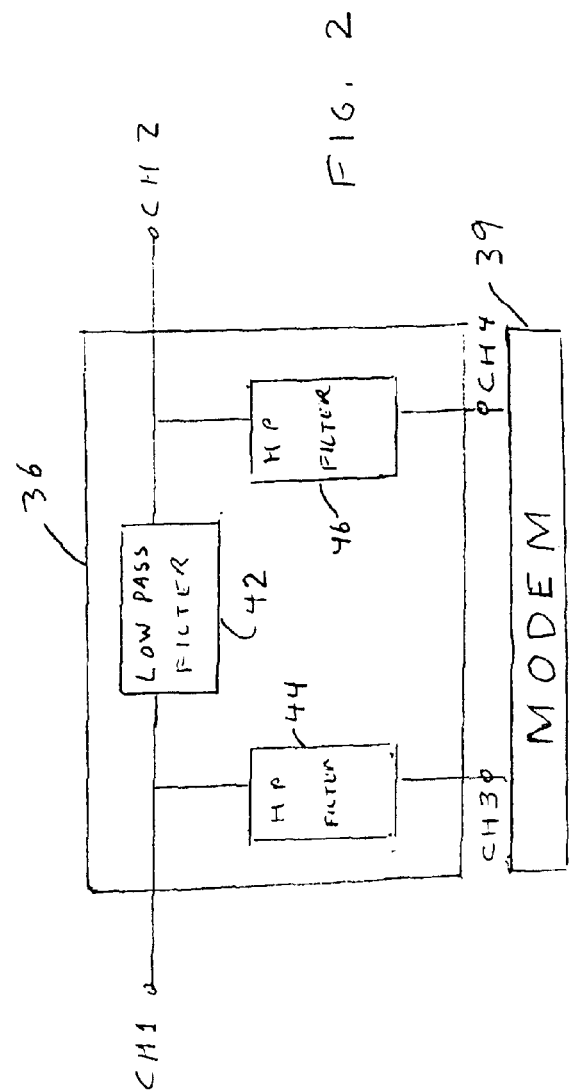
FIG. 2 is a block diagram of a diplexer in accordance with the invention.

FIG. 2 illustrates the major blocks of diplexer 36. A low pass filter 42 connects terminal CH1 to terminal CH2. A first high pass filter 44 connects terminal CH1 to terminal CH3. A second high pass filter 46 connects terminal CH2 to terminal CH4. As noted above, terminals CH1 and CH2 may be connected to opposite sides of a line extender amplifier. Terminals CH3 and CH4 may be connected to a modem 39 (FIG. 1). Thus, this first embodiment of the invention is considered to be a dual diplexer, in that the presence of two high pass filters assures that high frequency signals are passed around the low pass filter in two directions. The first direction is towards the customer from the direction of the cable head end (or to the customer's set top box), and the second direction is from the customer back towards the cable head end.

Figure 3:
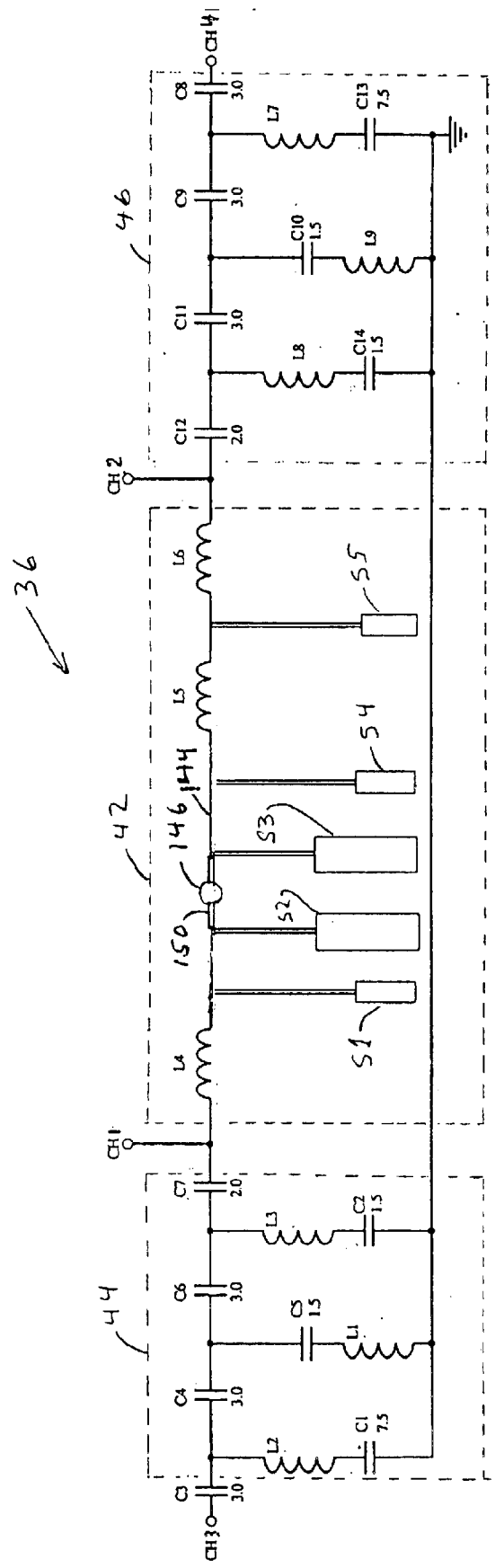
FIG. 3 is a schematic diagram of a first embodiment of the invention.

Referring to FIG. 3, FIG. 4 and FIG. 5, high pass filter 44, which is generally conventional in nature, includes capacitors C1, C2, C3, C4, C5, C6 and C7, as well as inductors L1, L2 and L3. Capacitors C1 to C7 are surface mounted chip devices of the type manufactured by Murata Corporation or ATC Corporation. Inductors L1, L2 and L3 are each formed from one or more turns of copper wire, with terminal ends extending form the circuit board of FIG. 4, as more fully described below. The component values may be chosen to implement a roll off frequency so that signals below approximately 900 MHz are blocked, while those above 907 MHz are passed with virtually no attenuation.

High pass filter 46 includes capacitors C8, C9, C10, C11, C12, C13 and C14, as well as inductors L7, L8 and L9. High pass filter 46 may be of identical construction and characteristics to that of high pass filter 44.

The high pass filters may also be designed as impedance transformers. The CH1 and CH2 terminals may operate at 75 ohms nominal impedance, as is the case for cable television, while the CH3 and CH4 terminals may match to 50 ohms, although with a different selection of components the CH3 and CH4 terminals could match 75 ohms.

Low pass filter 42 includes inductors L4, L5 and L6, each formed from several turns of copper wire. Low Pass filter 42 also comprises a series of tunable shunt elements S1, S2, S3, S4 and S5, as more fully described below.

FIG. 4 is an enlarged, partially cut away view of the physical lay out of the components of a first embodiment of the invention, and is approximately twice actual size, with the shunt elements shown in cross section. The components mentioned above are all attached to a printed circuit board 60. Circuit board 60 is surrounded at its periphery by thin tin plated steel housing wall portions 62 and 63, extending upwardly therefrom. Housing wall portions 62 and 63 form, with circuit board 60, a generally rectangular housing. A series of tabs 57 (FIG. 5), extending from each of housing wall portions 62 and 63, may be soldered to lands (not shown) on the underside of circuit board 60, to secure the sections of housing wall portions 62 and 63 to circuit board 60. A series of tabs 59, extending from each of housing wall portions 62 and 63 may be used to facilitate mounting of diplexer 36. A series of ground tabs 55, extending from ground plane lands of circuit board 60, provide terminals to which the braids of coaxial cables (not shown) may be soldered. The respective center conductors of these coaxial cables carry signals to and from terminals CH1, CH2, CH3 and CH4.

A generally rectangular internal shield 64 may be formed of sheet metal with small openings through which inductors L4 and L6 extend. Internal shield 64 may be soldered to lands on circuit board 60. One wall of the resulting enclosure 65 may be housing wall portion 62. The opposite wall 66 is formed with a series of round openings or holes, which are aligned with a corresponding series of holes 68, 70. 72. 74 and 76 in housing wall 62. Each shunt element S1, S2, S3, S4 and S5 includes an internally threaded brass tube (80, 82, 84, 86 and 88) which extends a very small distance outside of housing wall 62 at one end, and at least a similar distance into the enclosure 65 formed by shield 64 at the other end. The tubes 80, 86 and 88 extend only this small distance into enclosure 65, while tubes 82 and 84 extend a significant distance beyond so that tubes 82 and 84 are longer than tubes 80, 86 and 88. Tubes 80, 82, 84, 86 and 88 are secured to housing wall 62, shield 64, and lands on circuit board 60 by soldering thereto. All of the holes through which tubes 80, 82, 84, 86 and 88 pass are located so that a portion of the outer walls of tubes 80, 82, 84, 86 and 88 are in contact with circuit board 60. In other words, the top surface of circuit board 60 is tangent to tubes 80, 82, 84, 86 and 88.

Tubes 80, 82, 84, 86 and 88 serve as components of shunt elements S1, S2, S3, S4 and S5, respectively. While all of these shunt elements share essentially the same basic principles of operation, elements S1, S4 and S5 are of different design than that of elements S2 and S3.

Each shunt element has a cylindrically shaped, externally threaded tuning element 90, 92, 94, 96 and 98, received in its respective tube. Tuning elements 90, 92, 94, 96 and 98 are preferably formed of a polymer, such as polytetrafluroethylene (Teflon®) with a respective slot 100, 102, 104, 106, and 108 in their respective flat ends. These slots may receive the end of a suitably sized flat blade screwdriver (not shown), placed into tubes 80, 82, 84, 86 and 88 so that tuning elements 90, 92, 94, 96 and 98 may be rotated about their longitudinal axis, and thus move along the length of the respective tube in which they are received (due to engagement of their external threads with the corresponding internal threads of their respective tubes 80, 82, 84, 86 and 88).

Each tuning element 90, 92, 94, 96 and 98 has a respective cylindrical bore or opening 110, 112, 114, 116, and 118, that extends from its flat surface opposite that in which a slot is formed for a distance of approximately sixty to seventy percent of its length. These openings each receive a cylindrical metal conductor, which is part of the low pass filter 42.

In the case of shunt element S1, a first flat end of a brass rod 120, which extends into opening 110 of tuning element 90, is soldered to a first end of a printed circuit board pin 122. Pin 122 extends perpendicularly to circuit board 60, and is soldered to a land 124 on circuit board 60. One end of inductor L4 is also soldered to land 124. The electrical characteristics of shunt element S1 are determined by the position of tuning element 90 in tube 80, as the dielectric constant of the polymer from which tuning element 90 is formed, is different than that of the air, which occupies the portion of tube 90, between the internal threaded wall thereof and rod 120, not occupied by tuning element 90.

The construction of shunt elements S4 and S5 is virtual identical to that of shunt element S1. A respective circuit board pin 125, soldered to a land 126, is also soldered to the top of a respective brass rod 130, which extends into opening 116 of tuning element 96. A respective circuit board pin 132, soldered to a land 134, is also soldered to the top of a respective brass rod 140, which extends into opening 118 of tuning element 98. Inductor L5 has a first end soldered to land 126 and a second end soldered to land 134.

The diameter of rods 120, 130 and 140 is approximately sixty percent that of tuning elements 90, 96 and 98. Thus the ratio of the diameter of tubes 90, 96 and 98 to that of respective rods 120, 130 and 140 is relatively small, resulting in a transmission line element of low impedance.

A wire 144, soldered at one end to and extending upwardly from land 124, continues in a direction parallel to the longitudinal axis of tube 90, but slightly more distant from circuit board 60 than the longitudinal axis. Wire 144 then extend in a direction perpendicular to the longitudinal axis of tube 90 and is supported along that portion of its length by a post or standoff 146. Standoff 146 has a bore or opening 148 through which wire 144 passes, but is insulated therefrom, and along the central portion of its length, by a tubular insulating sleeve 150 which may be formed of Teflon®. Standoff 146 provides mechanical support for wire 144, but along with sleeve 150, also serves to change the impedance to ground at that portion of wire 144. This advantageously removes an undesirable peak in the passband of low pass filter 42.

Wire 144 continues in a direction parallel to the longitudinal axis of tube 96, but slightly more distant from circuit board 60, and in the same plane as the portion thereof extending parallel to the longitudinal axis of tube 90. Wire 144 then extends to land 126, to which it is soldered.

The various portions of wire 144 are in essence transmission line elements. Inductor L5 serves as another of these elements. When viewed in this fashion, the portions of shunt elements S1 through S5 described herein can also be considered transmission line elements.

A first coil element 154 has a first lead 156 which is soldered to wire 144 along its length to the left of standoff 146 in FIG. 4. A second lead 158 of coil element 154 extends into opening 112 of tuning element 92, and performs a function similar to that of rods 120, 130 and 140, in allowing tuning of shunt element S2. A second coil element 160 has a first lead 162 which is soldered to wire 144 along its length to the right of standoff 146 in FIG. 4. A second lead 164 of coil element 160 extends into opening 114 of tuning element 94, and also performs a function similar to that of rods 120, 130 and 140, in allowing tuning of shunt element S3.

After tuning is accomplished, by connection of appropriate test apparatus to diplexer 36 and adjustment of the positions of tuning elements 90, 92, 94, 96 and 98 with a screwdriver, a series of RTV rubber potting dabs 159 are used to immobilize the tuning elements against further rotation.

In shunt elements S2 and S3, the ratio of the diameter of tubes 92 and 94 to that of respective second lead 158 of coil element 154 and second lead 164 of coil element 160 is relatively large, resulting in a transmission line element of high impedance.

Diplexer 36 is provided with a thin, sheet metal removable cover 167, having peripheral lips 168, that snap on to ridges (not shown) in portions of housing wall portions 62 and 63. A similar approach is taken to provide an internal cover 169 for enclosure 65 (defined in part by shield 64) of the transmission line portion of low pass filter 42.

Shunt elements S1, S4 and S5 of low pass filter 42 are low impedance elements analogous in some respects to series tuned circuits. Shunt elements S2 and S3 of low pass filter 42 are low impedance series tuned circuits. There are significant advantages to the structure of these elements. The Q of these elements is in the range of 300 to 400, thus minimizing losses, and maximizing rejection of unwanted signals over a very broad range of frequencies. This is a very significant improvement over a Q of about 100 generally available with discrete components. In addition, the elements can be precisely adjusted with the use of a screwdriver to perform tuning, to move resonant frequencies, as described above. This is because the part of the tubes filled with a tuning element has a lower impedance than that of the parts filled with air, by a factor of approximately 1.4. This factor is the square root of the ratio of the dielectric constants of air, which is 1.0 to that of the polymer, which is approximately 2.0.

The design is also unique in that coaxial distributed line elements are combined with lumped elements. Further, helical lines are used for the distributed elements to obtain sensitivity (low insertion loss) and high isolation.

Additional advantages of the structures of the shunt elements are low weight, small size, and low cost. Further, inductors L4, L5 and L6 and wire 144 are designed to carry up to 15 amperes (60 Hz at 90 volts) to power components of the cable system.

Figure 6:
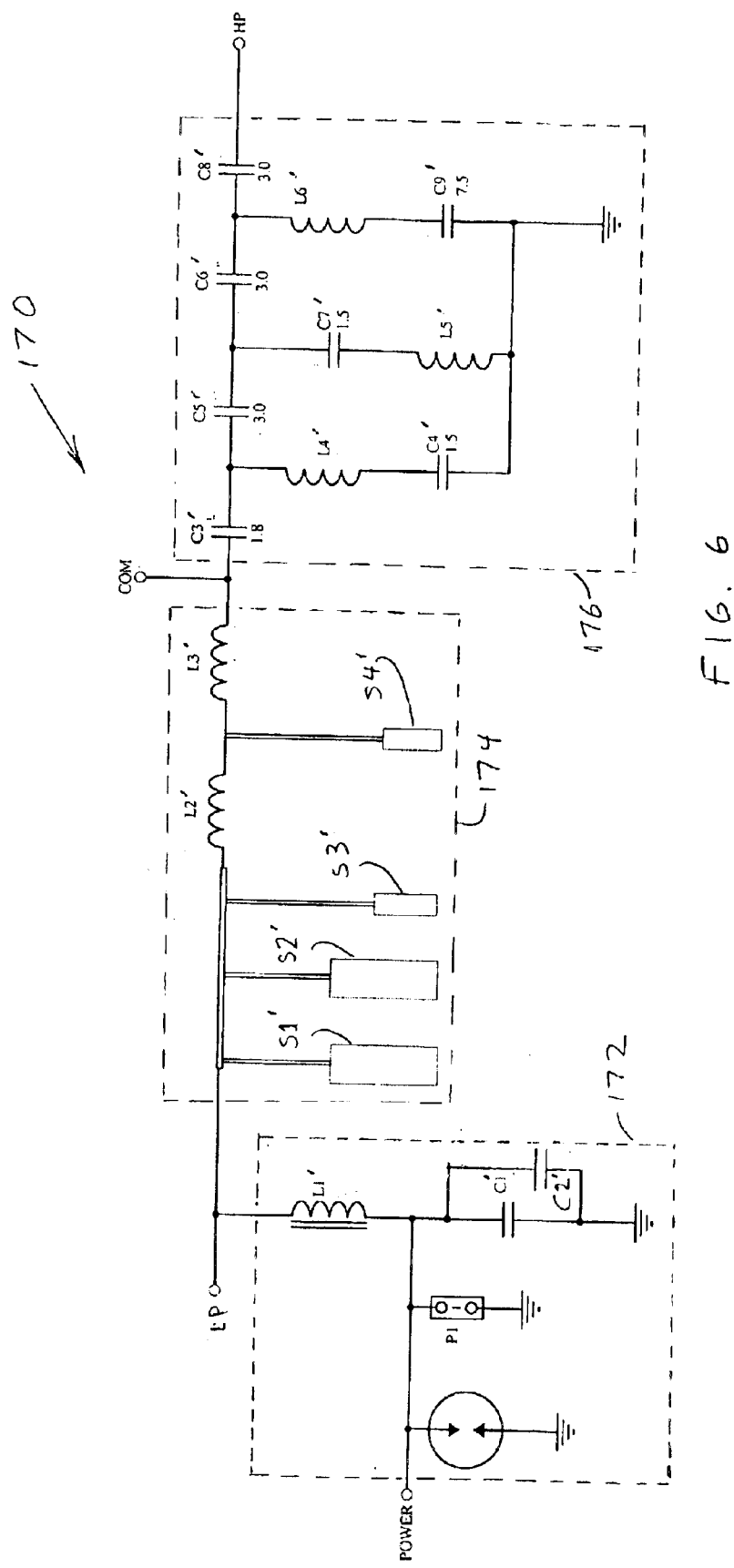
FIG. 6 is a schematic diagram of the second embodiment of the invention.

FIG. 6, FIG. 7, FIG. 8 and FIG. 9 illustrate a second embodiment of the invention. Referring principally to FIG. 6, the diplexer 170 of this second embodiment has a power management section 172, a low pass filter section 174, and a single high pass filter 176. The low pass filter 174 and the high pass filter section 176 are connected together at a common node COM, which may serve as a test point. A test point structure TP is provided for this purpose (FIG. 7). A jack J2, mounted on printed circuit board 186, is used for signal input. Terminal HP of high pass filter 176 is connected to a cable assembly 178, which terminates in a conventional cable connector 180. The output LP of the low pass filter terminates in a jack J1 (FIG. 7 and FIG. 9), connected by an insulated wire 181, to a land 250 (FIG. 7).

Power management section 172 includes an inductor L1' which is generally fairly large so as to be able to carry a significant power supply current, and is of a sufficiently high inductance so as to completely block any radio frequency of 5 MHz or above. Two bypass capacitors C1' and C2' serve to remove any radio frequency components from the power that is applied to the POWER input terminal and appears at a power plug P1 having PWR and GRD terminals. One of these capacitors is of a high value, to assure that almost alternating current components of most frequencies are passed to ground, while another is of low inductance, such as a ceramic capacitor, to assure that high frequency components are shorted to ground. A sidactor 182, generally of a self-healing type, having a rating of 500 amperes is placed across the power plug as a surge and lightening protector.

High pass filter 176 is made up of capacitors C3', C4', C5', C6', C8' and C9', and inductors L4', L5' and L6'. The same observations made with respect to high pass filters 44 and 46 of diplexer 36 may be applied to high pass filter 176.

Referring principally to FIG. 7, the mechanical configuration of diplexer 170 is different than that of diplexer 36. A circuit board 186 has a first housing wall 188, formed of sheet metal, extending upwardly therefrom. An internal partition wall 190, having an opening for one of the leads of inductor L3, divides the enclosure, defined in part by housing wall 188, into a first compartment 192 for the components of high pass filter 176, and a second compartment 194 for components of low pass filter section 174. A snap on cover 175, similar to those described above, is provided for housing wall 188.

A lower housing 192 (see FIG. 9 also) covers the portion of the bottom of circuit board 186 which corresponds generally, but not precisely, to the top portion enclosed by first housing 188. A coil housing 196 encloses inductor L1', capacitor C1' and capacitor C2'. A snap on cover 198 is provided for coil housing 196.

Low pass filter section 174 is constructed in accordance with many of the same principles outlined above with respect to low pass filter 42 of diplexer 36. Inductors L2' and L3' act as lumped line elements. Shunt elements S3' and S4' are similar in construction to shunt elements S1, S3 and S4 of FIG. 4. Shunt element S2' is similar in construction to shunt element S2 and S3 of FIG. 4. However shunt element S1' has only a straight wire extending into its respective tuning element, instead of a helical lumped element (or coil) along its length.

More specifically, shunt elements S1', S2', S3' and S4' are defined by internally threaded brass tubes 200, 202, 204 and 206, extending through openings holes 201, 203, 205 and 207 in housing wall 188. Respective Teflon® tuning elements 210, 212, 214 and 216, having respective screwdriver slots 220, 222, 224 and 226, are disposed therein. Respective bores or openings 230, 232, 234 and 236 receive respective conductors which associated with low pass filter section 174.

The lead of inductor L3 not extending through partition 190 is soldered to a land 241 on printed circuit board 186. Land 241 has, extending upwardly therefrom a printed circuit pin 242. One lead of inductor L2' is also soldered to land 241. The other lead of inductor L2' is soldered to a land 243. Land 243 has a printed circuit pin 244 extending upwardly therefrom. A wire 246 has a first end soldered to land 243 and extends upwardly therefrom. Wire 246 then extends parallel to circuit board 186, first slanting away from the general direction of coil housing 196, and then towards coil housing 196, in a direction perpendicular to the longitudinal axes of tubes 200, 202, 204 and 206. Wire 246 is supported along its length by a printed circuit board pin 248. Wire 246 then extends toward a land 250, where it has a portion that extends downwardly to land 250, so as to be soldered thereto. One lead of inductor L1' extends through aligned openings in housing wall 188 and coil housing 196 and is insulated therefrom by an insulating bushing 252. The end of that lead is soldered to land 250.

A wire 260 has an end soldered to and extending upward from land 250 and another end extending into opening 230 of tuning element 210. Thus, element has an impedance matching function. A coil element 262 has a first lead soldered to pin 248 and a second lead extending into opening 232 of tuning element 212. A first rod 264 extends into opening 234 of tuning element 214. A second rod 266 extends into opening 236 of tuning element 216.

It will be understood that after tuning, by rotating tuning elements 210, 212, 214 and 216 with a screwdriver, of RTV rubber dabs 268 are applied to immobilize the tuning elements.

The second embodiment of the invention, having only one high pass filter section, is not considered to be a dual diplexer. However, it provides all of the other advantages discussed above with respect to the first embodiment of the invention, of improved sensitivity, low insertion losses, and excellent rejection of unwanted signals. Further, it is also low in cost and easy to manufacture, allowing it to be used in a wide range of difficult applications.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A low pass filter comprising:
   a first series of transmission line elements connected between an input and an output of said low pass filter; and a second series of shunt elements connected from said transmission line elements to a ground of said low pass filter, at least one of said shunt elements having a distributed portion and a lumped portion.

2. The low pass filter of claim 1, wherein said distributed portion comprises a tube.

3. The low pass filter of claim 2, wherein said lumped portion comprises a coil with a first lead connected to said first series of transmission line elements, and a second lead extending into said tube.

4. The low pass filter of claim 3, further comprising a tuning element moveably disposed in said tube.

5. The low pass filter of claim 4, wherein said tuning element has an opening for receiving said second lead of said coil.

6. The low pass filter of claim 4, wherein a respective tuning element has an opening for receiving said second lead of said coil.

7. The low pass filter of claim 1, wherein said shunt elements each comprise a tube, and said tubes are mounted on a printed circuit board.

8. The low pass filter of claim 7, wherein said tubes are mounted tangentially on said circuit board.

9. The low pass filter of claim 7, wherein said first series of transmission line elements include a wire connected between a first land on said printed circuit board and a second land on said printed circuit board, said wire having a portion positioned to extend in a direction parallel to a plane of said printed circuit board.

10. The low pass filter of claim 9, further comprising a support member extending from said circuit board for supporting said wire at a predetermined distance from said circuit board.

11. The low pass filter of claim 10, further comprising an insulating sleeve disposed around said wire, said sleeve being positioned to insulate said wire from said support member.

12. The low pass filter of claim 11, wherein said insulating sleeve and said support member form an additional shunt element of said low pass filter.

13. The low pass filter of claim 1, further comprising at least one lumped element connected in series with said first series of transmission line elements.

14. The low pass filter of claim 13, wherein said at least one lumped element comprises a coil.

15. The low pass filter of claim 13, wherein said lumped element is connected to lands on a circuit board.

16. The low pass filter of claim 15, wherein said shunt elements comprise tubes mounted on said circuit board.

17. The low pass filter of claim 16, wherein said lumped portion comprises a coil with a first lead connected to said first series of transmission line elements, and a second lead extending into one of said tubes.

18. The low pass filter of claim 17, further comprising a tuning element moveably disposed in each of said tubes.

19. The low pass filter of claim 1, wherein at least one of said first series of said shunt elements comprises a tube, further comprising:
an electrical conductor connected to said first transmission line elements, and
a tuning element movable within said tube, said tuning element having an opening for receiving said electrical conductor.

20. The low pass filter of claim 19, wherein said electrical conductor is a rod.

21. The low pass filter of claim 20, further comprising:
a circuit board on which said tube is mounted, and a pin extending from said circuit board, an end of said rod being soldered to said pin.

22. A filter comprising:
a first series of transmission line elements connected between an input and an output of said filter; and
a second series of shunt elements connected from said transmission line elements to a ground of said filter, at least one shunt element including a tube and a conductor extending into said tube, said tube being mounted on a circuit board.

23. The filter of claim 22, further comprising a tuning element moveably disposed in each said tube.

24. The filter of claim 23, wherein said tuning element has an opening for receiving a respective conductor.

25. A diplexer comprising:
a low pass filter including:
a first series of transmission line elements connected between an input and an output of said low pass filter; and
a second series of shunt elements connected from said transmission line elements to a ground of said low pass filter, at least one of said shunt elements having a distributed portion and a lumped portion; and
a high pass filter connected between said input of said low pass filter and a first high pass filter output.

26. The diplexer of claim 25, further comprising an additional high pass filter connected between said output of said low pass filter and a second high pass filter output.

27. The diplexer of claim 26, wherein each of said high pass filters serves as an impedance transformer.

28. The diplexer of claim 26, wherein the first high pass filter output and second high pass filter output match a lower impedance than that of said input of said low pass filter and said output of said low pass filter.

29. The diplexer of claim 28, wherein said lower impedance is fifty ohms.

30. The diplexer of claim 25, wherein said high pass filter serves as an impedance transformer.

31. The diplexer of claim 25, wherein the high pass filter output matches a lower impedance than that of said input of said low pass filter and said output of said low pass filter.

32. The diplexer of claim 31, wherein said lower impedance is fifty ohms.

33. The diplexer of claim 25, wherein said low pass filter is adapted to carry electrical power from an electrical power source between said input and an output of said low pass filter.

34. The diplexer of claim 33, wherein said first series of transmission line elements carry said power.

35. The diplexer of claim 33, further comprising a power management circuit for receiving and distributing said power.

36. The diplexer of claim 35, wherein said power management circuit comprises:
a choke having a first terminal connected to said output of said low pass filter, and
bypass capacitance connected from a second terminal of said choke to ground of said diplexer.

37. The diplexer of claim 36, wherein said bypass capacitance comprises:
a first relatively large capacitor, and
a second smaller capacitor for providing a low impedance for high frequency signals.

38. The diplexer of claim 36, further comprising a power protection element connected in parallel with said capacitance.

39. The diplexer of claim 38, wherein said power protection element is a sidactor.

40. The diplexer of claim 36, further comprising a power connector connected in parallel with said capacitance.

41. The diplexer of claim 25, wherein said distributed portion comprises a tube.

42. The diplexer of claim 41, wherein said lumped portion comprises a coil with a first lead connected to said first series of transmission line elements, and a second lead extending into said tube.

43. The diplexer of claim 42, further comprising a tuning element moveably disposed in said tube.

44. The diplexer of claim 43, wherein said tuning element has an opening for receiving said second lead of said coil.

45. The diplexer of claim 25, wherein said shunt elements each comprise a tube, and said tubes are mounted on a printed circuit board.

46. The diplexer of claim 45, wherein said tubes are mounted tangentially on said circuit board.

47. The diplexer of claim 45, wherein said first series of transmission line elements include a wire connected between a first land on said printed circuit board and a second land on said printed circuit board, said wire having a portion positioned to extend in a direction parallel to a plane of said printed circuit board.

48. The diplexer of claim 47, further comprising a support member extending from said circuit board for supporting said wire at a predetermined distance from said circuit board.

49. The diplexer of claim 48, further comprising an insulating sleeve disposed around said wire, said sleeve being positioned to insulate said wire from said support member.

50. The diplexer of claim 49, wherein said insulating sleeve and said support member form an additional shunt element of said low pass filter.

* * * * *